United States Patent [19]

Gopani et al.

[11] Patent Number: 5,077,545
[45] Date of Patent: Dec. 31, 1991

[54] SURFACE ACOUSTIC WAVE WAVEGUIDE-COUPLED RESONATOR NOTCH FILTER

[75] Inventors: Sunder G. Gopani, Apopka; Brent H. Horine, Orlando, both of Fla.

[73] Assignee: Sawtek, Inc., Orlando, Fla.

[21] Appl. No.: 517,823

[22] Filed: May 2, 1990

[51] Int. Cl.[5] .............................................. H03H 9/25
[52] U.S. Cl. .................... 333/195; 310/313 D; 310/313 R
[58] Field of Search .................. 333/195; 310/313 R, 310/313 B, 313 D

[56] References Cited

U.S. PATENT DOCUMENTS

| | | | |
|---|---|---|---|
| 3,446,975 | 5/1969 | Adler et al. | 310/313 B |
| 3,582,837 | 6/1971 | DeVries | 310/313 D |
| 4,028,648 | 6/1977 | Hartmann et al. | 310/313 R |
| 4,063,202 | 5/1976 | Vasile | 310/313 R |
| 4,184,131 | 1/1980 | Haus | 333/195 |
| 4,398,114 | 8/1983 | Minagawa et al. | 333/195 |
| 4,542,356 | 9/1985 | Nakazawa et al. | 310/313 D |
| 4,689,586 | 8/1987 | Yamada et al. | 310/313 D |
| 4,803,449 | 2/1989 | Hikita et al. | 310/313 R |
| 4,939,487 | 7/1990 | Yuhara et al. | 333/195 |
| 4,954,793 | 9/1990 | Misu et al. | 310/313 R |

FOREIGN PATENT DOCUMENTS

| | | | |
|---|---|---|---|
| 0100503 | 2/1984 | European Pat. Off. | 333/195 |
| 3048817 | 9/1981 | Fed. Rep. of Germany | 333/195 |
| 0000610 | 1/1980 | Japan | 333/195 |
| 0194615 | 11/1982 | Japan | 333/195 |

OTHER PUBLICATIONS

"Low Loss Multipole SAW Resonator Filters", by E. Staples et al., 1980, IEEE MTT-S International Microwave Symposium Digest; pp. 34–36.

*Primary Examiner*—Mark O. Budd
*Assistant Examiner*—Thomas M. Dougherty
*Attorney, Agent, or Firm*—Duckworth, Allen, Dyer & Doppelt

[57] ABSTRACT

A surface acoustic wave (SAW) waveguide-coupled resonator filter is overcoupled to produce an essentially constant conductance and susceptance over at least the bandwidth of a desired notch filter. The SAW resonator filter is embedded in a bridged-T allpass circuit to provide the pair of equal capacitances of the circuit, and the resonator ground is connected to one terminal of the parallel inductor of the circuit having the other terminal connected to a system ground.

8 Claims, 5 Drawing Sheets

SURFACE ACOUSTIC WAVE WAVEGUIDE-COUPLED RESONATOR NOTCH FILTER

FIELD OF THE INVENTION

The present invention relates to low insertion loss acoustic wave waveguide-coupled resonator filters, and more particularly to bandpass and notch filters for radio frequency systems.

BRIEF DESCRIPTION OF THE PRIOR ART

Low-loss, narrowband filters with high selectivity are required in many communication applications for use at the front end of the receiver. The narrow bandwidth reduces intermodulation distortion and high selectivity is needed to reject the spurious image. For receivers in the VHF and UHF range, surface acoustic wave (SAW) resonator filters have been widely accepted as the optimum filter solution. The SAW resonator filters exhibit the desired low-loss, narrowband, high rejection characteristics, are inherently small, and are stable over a wide range of temperature.

For filter applications that require very narrowband and high close-in rejection, the waveguide-coupled (WGC) resonator configuration is admirably suited. The WGC resonator filter is inherently small in size and exhibits good close-in rejection. However, the WGC resonator has inadequate insertion loss and ultimate rejection for many applications. There is thus a need for a WGC resonator having a low insertion loss and improved close-in rejection.

Another application of the SAW device is a filter which rejects a narrow band of frequencies and passes the rest, referred to as a notch filter. SAW notch filters have a wide range of use in RF communications. For example, CATV systems use the SAW notch filter to deny access to premium signals for basic subscribers. In RF communication systems, a SAW notch filter can be used to suppress the intermodulation product resulting from interference of an unwanted adjacent carrier.

A common prior art two-pole WGC resonator 10 is shown in FIG. 1, and includes a pair of resonators each having an interdigital transducer 12 and a pair of reflectors 13 deposited on a piezoelectric substrate such as quartz or lithium tantalate. The transducer 12 is formed of a large number of aluminum electrodes 14, usually 300 finger pairs, and typically ¼ wavelength wide. When the input transducer is driven by an RF field, surface acoustic waves will be generated due to the piezoelectric effect. As the wave travels along the crystal from the free surface to the region under the electrode, it experiences an impedance mismatch and some of the wave is reflected by a reflector. For an electrode spacing of one-half acoustic wavelength, the reflections add in phase. If the number of electrodes is large enough, it will behave as a resonator. The reflectors are normally made up of ¼ wavelength shorted aluminum electrodes, which enhance the reflections and thereby reduce loss of the resonator. The reflections within the resonator slow down the effective velocity of the acoustic wave. The resonator thus behaves like a waveguide. Depending on the aperture and electrode thickness of the resonator, the waveguide can support the propagation of various transverse modes.

FIG. 1 also illustrates the energy distribution 11 for the lowest order mode of the resonator. As can be seen, some of the energy is necessarily present outside the apertures 16 of the resonator to satisfy the boundary conditions of the waveguide. When two such resonators are placed close together, an acoustic coupling of energy from one resonator to the other occurs. The amount of coupling is directly proportional to the overlapping of the energy "tails", which in turn depends upon the aperture and the coupling gap 17. Narrowing the gap will result in a stronger coupling between the two resonators.

Typically, the coupling gap is set about one wavelength. The ground bus bar 15 is thus of the order of 0.5 wavelength if ¼ wavelength is allowed for the gap between the electrode and the ground bus bar. From 100 MHz to 1000 MHz center frequencies of operation, the 0.5 wavelength ground bus bar width varies from 0.6 mils to 0.06 mils. This is too narrow for a bond attach, hence the ground is normally attached at both ends of the reflectors as shown in the FIG. 1. The narrow ground bus bar has high RF resistance and provides poor grounding, resulting in higher loss and poorer rejection.

Prior art SAW notch filters commonly use a single pole resonator as has been demonstrated by Akiit[2]. Typical transmission characteristics of a single pole resonator SAW notch filter using Akiit's method yields a very narrowband notch due to the fast phase transition of the resonator. Such a configuration has little application since the drift over temperature is typically more than the notch bandwidth. The rejection bandwidth of a practical notch filter should be wide enough to accommodate the desired reject signal, the drift over the temperature range of operation and the manufacturing tolerance.

A single phase unidirection transducer has also been used in the prior art to realize a SAW notch filter. See U.S. Pat. No. 4,577,168 and U.S. Pat. No. 4,599,587 to Hartmann. A SAW notch filter using these prior art techniques achieves the wideband characteristics desired, but presents other problems. The center of reflection from the center of transduction must be offset by ⅛ wavelength. It is very difficult to optimize the phase condition of the single phase unidirectional transducer and the temperature stability of the notch filter simultaneously. Furthermore, the performance of this notch filter is quite sensitive to manufacturing tolerances such as wafer misalignment and variation in the metal thickness.

Additionally, the aperture of the filter usually varies from 10 to 150 wavelengths and requires a large number of finger pairs. The die size increases quite dramatically at lower frequencies of operation, limiting the use of the Hartman notch filter configuration to center frequencies above 150 MHz. There is a need for a SAW notch filter capable of operation as low as 50 MHz center frequency that is stable and avoids the manufacturing limitations discussed above.

SUMMARY OF THE INVENTION

The invention will be described with reference to a two pole WGC resonator filter having low insertion loss and high rejection, with the filter used to realize a SAW notch filter.

As noted, such filters in the prior art have significant losses in the ground bus bar. For example, a typical ground bus bar has been measured having resistances of 14.5 ohms at 100 MHz to 174.0 ohms at 900 MHz, and the resistance increases significantly with an increase in center frequency. The WGC resonator of the invention reduces the ground bar resistance and improves isolation between input and output, achieving a lower loss filter.

The invention uses an improved ground system that reduces the ground bus bar resistance. Each input-output transducer pole pad is broken at its center, and the ground electrode is extended along the break in the transducer pads. Thus, additional ground connection pads may be provided, and additional ground bonds to the center of the ground bus bar are provided. The periodicity of the electrodes is unchanged by maintaining the extended ground electrode width the same along the path of wave propagation. A jumper bond is used to reconnect the split portions of the transducer pad. The additional ground pads reduce the bus bar resistance by about half. For example, at 500 MHz center frequency the bus bar resistance of the configuration is 39 ohms as compared to the 78 ohms of the conventional configuration. More than one grounding pad can be added to the transducer to further reduce the bus bar resistance to an acceptable level. The lower resistance bus bar provides a better ground reference which electrically isolates the input and the output ports for frequencies off resonance. The filter thus provides a very good ultimate rejection, and exhibits very low parasitic resistance.

The improved two-pole resonator of the invention may be incorporated into an all-pass filter to provide an improved SAW notch filter. As is well known in the art, an allpass network as shown in FIG. 5 is a circuit that allows the passage of all frequencies with no attenuation. In the SAW waveguide-coupled resonator notch filter configuration, the static capacitance of the resonator pole replaces the capacitance element C2 of the allpass network.

The two-pole WGC resonator exhibits a fairly constant phase slope over a certain bandwidth, $f_1-f_2$, which provides the desired constant susceptance characteristics for $C_2$ of the allpass network. The amplitude response, which reflects the conductance term of the resonator, is approximately constant over the region from $f_1$ to $f_2$. The Q of the resonator will determine the depth of the notch when placed in the allpass network. From $f_1$ to $f_2$, the Q remains very low which achieves good rejection bandwidth. Outside the $f_1$ to $f_2$ region, the Q of the resonator is high which minimizes the passband loss. The WGC resonator thus has all the essential characteristics to realize a SAW notch filter.

In one implementation of the two-pole WGC resonator notch filter, a bridged-T allpass network is embedded therein, and achieved a fractional bandwidth of 0.029%. The widening of the notch bandwidth is possible due to the strong coupling between the resonators which results in an approximately constant amplitude and phase slope over a desired frequency band. Thus, the resonator Q is approximately constant and maintained at a very low value to provide the notch depth over the desired bandwidth. The bandwidths as realized in the two-pole SAW WGC resonator notch filter are adequate to accommodate the temperature drift and manufacturing tolerance when a single CW tone or carrier signal rejection is desired. The notch depth is approximately 25 dB down. If greater rejection is desired, two such cascaded configurations can be used.

When the improved two-pole WGC resonator of the invention is embedded in a bridged-T allpass network, the reduced ground bus losses also permits use of the device at higher frequencies.

It is therefore a principal object of the invention to provide a two-pole WGC resonator having low ground bus bar resistance at VHF to UHF frequency ranges.

It is another object of the invention to provide a two-pole WGC resonator having the input and output transducers split and the ground bus bar extended to provide one or more grounding pads.

It is still another object of the invention to provide a two-pole WGC resonator notch filter having a relatively broad, stable notch.

It is yet another object of the invention to provide a notch filter usable at VHF to UHF frequency ranges having a twopole WGC resonator embedded in an allpass filter.

These and other objects and advantages of the invention will become apparent from the following detailed description when read in conjunction with the drawings.

DETAILED DESCRIPTION OF THE PREFERRED EMBODIMENT

Figure 2:
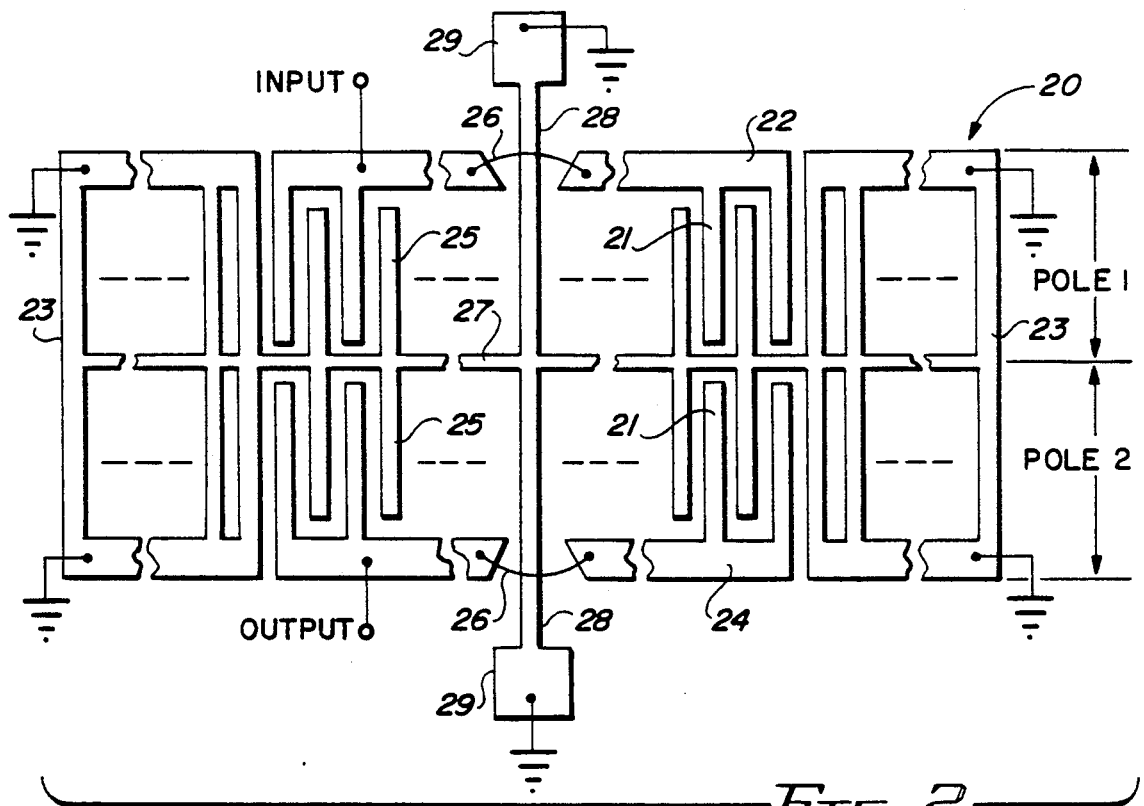
FIG. 2 is a schematic diagram of an improved two-pole SAW resonator in accordance with the invention.

The present invention is a surface acoustic wave (SAW) device having a lower ground bus bar loss permitting improved operation at high frequencies, and a SAW notch filter that may be implemented using the SAW device. Referring to FIG. 2, a two-pole SAW resonator filter 20 in accordance with the invention is shown in schematic form. The two-pole resonator filter 20 comprises a pair of resonators. The input resonator includes an input transducer 22 and a pair of reflectors 23 formed of conductive electrode material, which may be aluminum, deposited on a suitable piezoelectric substrate such as quartz or lithium tantalate. The output resonator includes a transducer 24 and a similar pair of reflectors 23. The input and output resonators are coupled to each other along the ground bus bar 27. It is to be understood that the number of fingers 21, 25 is selected in accordance with the required characteristics of the device as known in the art. For example, 300 finger pairs may be used. The dashed lines in FIG. 2 represent additional fingers not shown.

As shown in FIG. 2, the pairs of reflectors 23 disposed at each end of transducers 22 and 24 are grounded, by the ground bus bar 27 running the length of resonator 20. In accordance with the invention, transducers 22 and 24 are divided into two separate sections physically, with the two sections electrically interconnected by jumpers 26. An additional ground bus bar 28 is disposed at right angles to bus bar 27 and connects bus bar 27 to ground pads 29. As may be recognized, reflectors 23 and pads 29 are grounded to a ground plane when installed in a system using the resonator 20. The number of the grounding attachments of the bus bar is effectively increased, and the bus bar resistance reduced.

Figure 3:
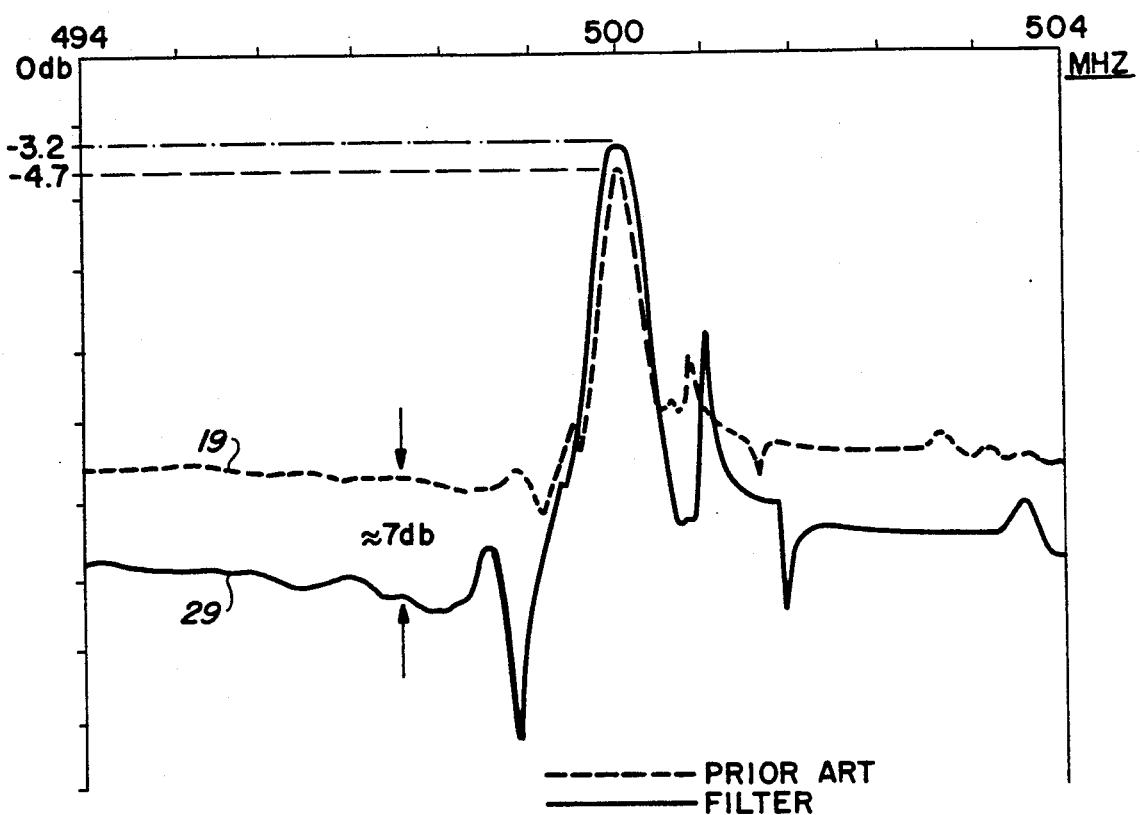
FIG. 3 is a plot of the frequency response of typical examples of the resonators of FIGS. 1 and 2.

In an experimental version of the invention, two 500 MHz, two-pole WGC resonator filters were construed: a first using prior art designs; and a second in accordance with the circuit of FIG. 2. FIG. 3 is a plot of the frequency response of the two experimental filters. The solid line response for the filter of the invention indicated 1.5 db less insertion loss, and about 7 db greater rejection than the prior art filter response, shown by the dashed line.

Generally, four or more poles are used in practical applications by cascading. Thus, the improvements obtained will be cascaded. Additional benefits of the invention are permitting a narrower coupling gap (17 of FIG. 1) for broader bandwidth, and thinner electrode thickness to suppress spurious modes.

Figure 4:
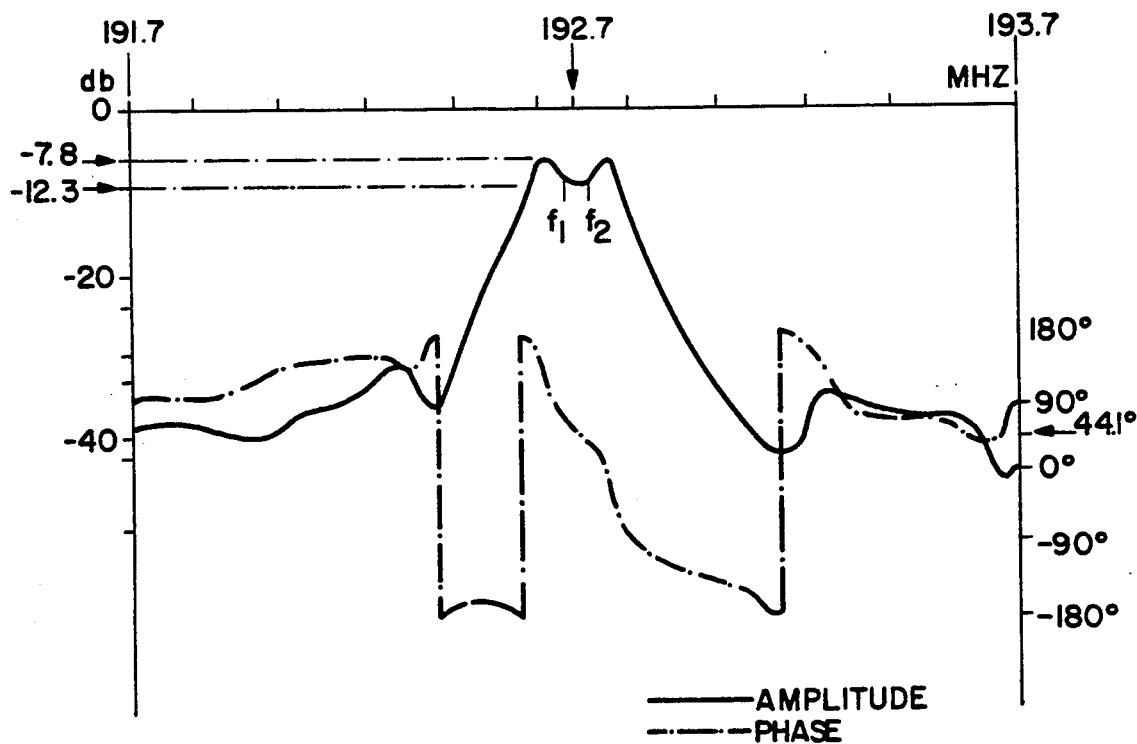
FIG. 4 is a plot of the frequency and phase response of an overcoupled two-pole SAW resonator of the prior art.

It is desirable to utilize two-pole SAW type resonators for notch filters. FIG. 4 shows the amplitude and phase response of a typical prior art closely coupled, two-pole SAW resonator. The center frequency is 192.7 MHz and an insertion loss of $-7.8$ to $-12.3$ db over the passband. The resonator exhibits a fairly constant phase slope over the passband, providing a constant susceptance characteristic required for a notch filter. The amplitude response, reflecting the conductance term of the resonator, is essentially constant over the passband $f_1-f_2$. The Q of the resonator will determine the depth and width of a notch when the resonator is used in a notch filter, and will be very low for the noted bandpass. Outside of this bandpass, the Q is high which is required to minimize the passband loss.

Figure 5:
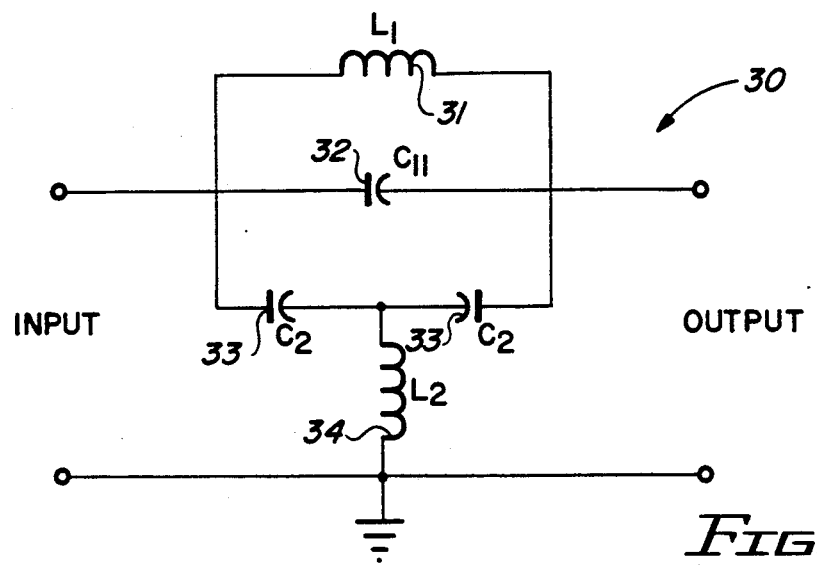
FIG. 5 is a schematic diagram of an allpass network of the prior art.
Figure 6:
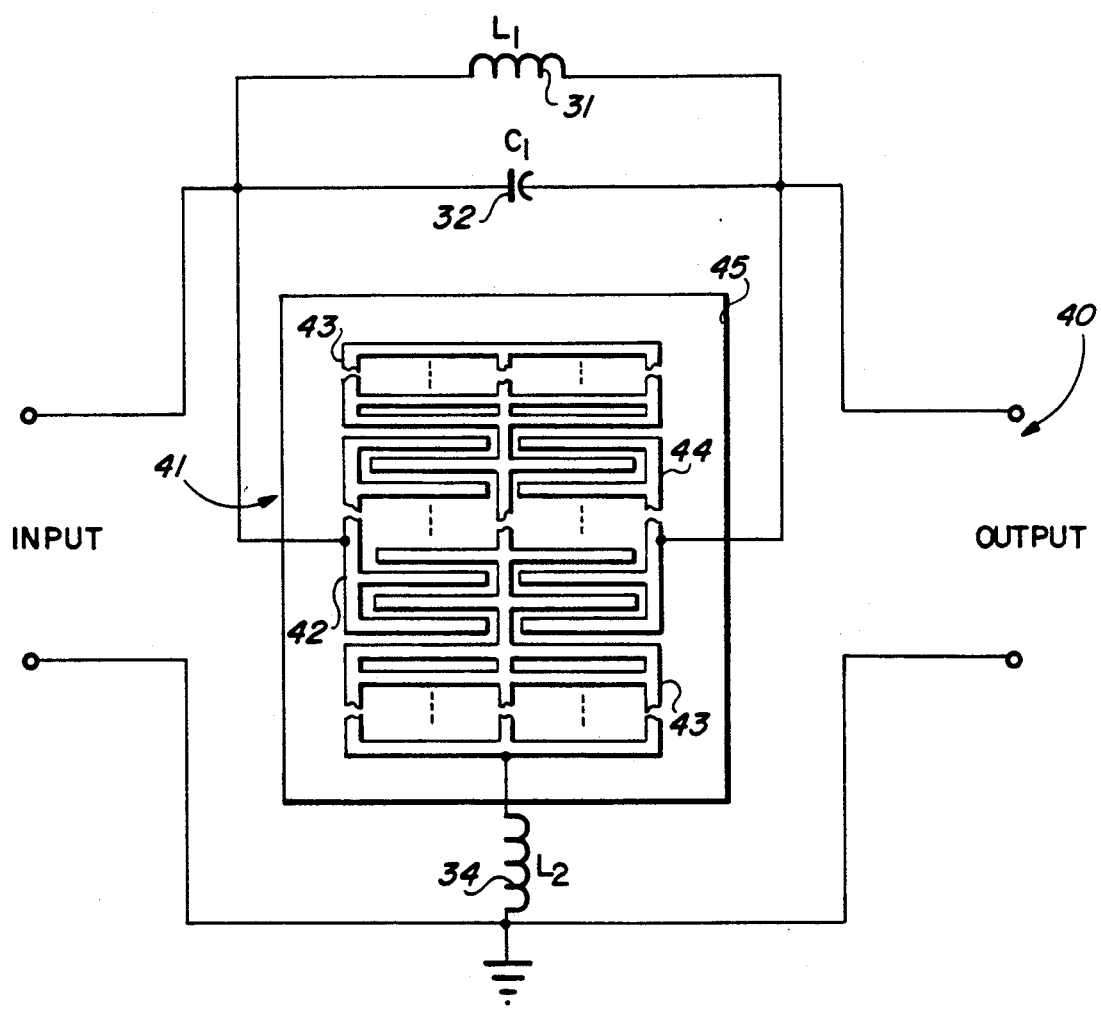
FIG. 6 is a schematic diagram of a SAW resonator notch filter in accordance with the invention.

The above noted characteristics of the two-pole SAW resonator have been found to be ideal for combining with an allpass network 30 of the type shown in FIG. 5, known as a bridged-T allpass network. An inductor $L_1$ (31) is in parallel with a capacitor $C_1$ (32), and series capacitors $C_2$ (33), and in series with the load. Inductor $L_2$ (34) connects from the junction of the two capacitors 33 to ground. The input and output transducers of a two-pole SAW resonator have the correct capacitance at its center frequency to provide the two capacitances 33 in the bridged-T network, when connected as shown in the schematic diagram of FIG. 6.

Figure 1:
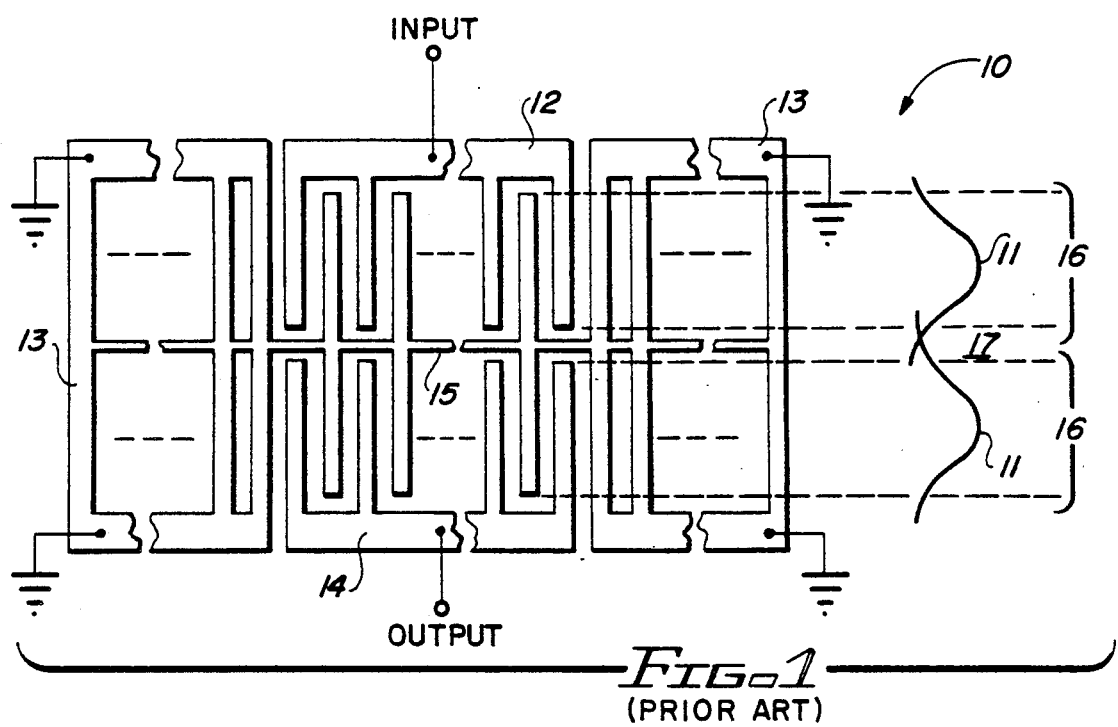
FIG. 1 is a schematic diagram of a prior art two-pole SAW resonator.

A two-pole SAW resonator 41 of the prior art type of FIG. 1 is fabricated on piezoelectric substrate 45 and has its input transducer 42 and output transducer 44 connected across the parallel circuit of inductor 31 and capacitor 32, and provides capacitances $C_2$. The reflectors 43, which are at ground potential with respect to resonator 41, are connected to inductor 34.

Figure 7:
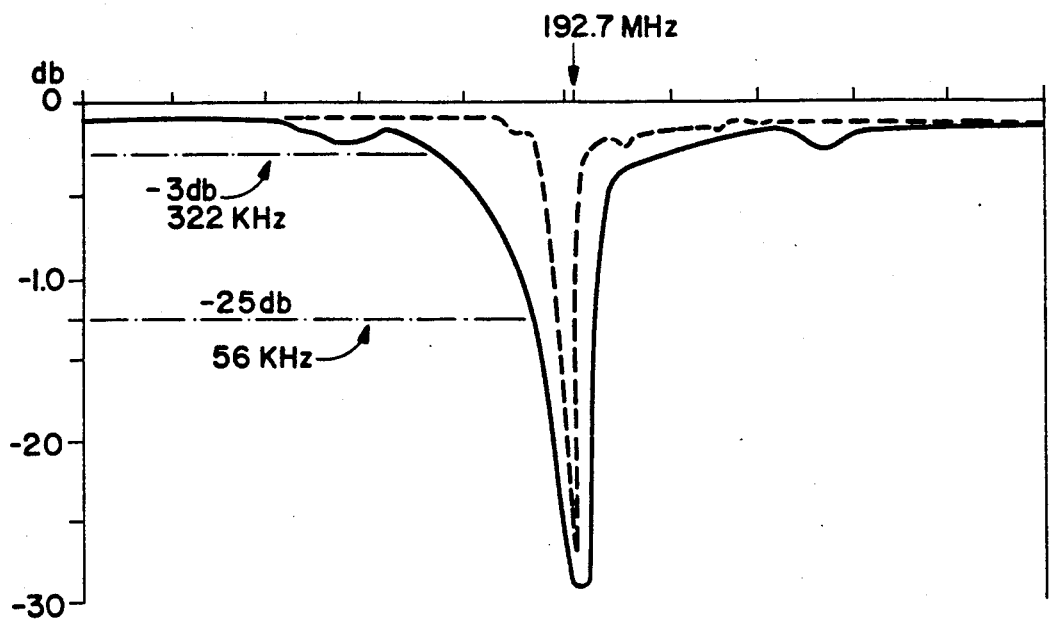
FIG. 7 is a plot of the frequency response of a typical SAW notch filter in accordance with the circuit of FIG. 6, compared with a prior art SAW notch filter.

An experimental SAW notch filter in accordance with the invention was constructed using a SAW resonator having the characteristics shown in FIG. 4. FIG. 7 is a plot of the frequency response of the experimental notch filter, shown by the solid line, and compared with a prior art single-pole SAW notch filter. The half-power bandwidth was 322 kHz. A 25 db bandwidth of 56 kHz, and a notch depth of about 25 db were obtained. The insertion loss was 2.4 db. The single-pole filter embedded in the allpass network had a fractional bandwidth of 0.001%, which is too narrow for practical applications. The notch filter of the invention produced a 0.029% fractional bandwidth, adequate to accommodate the temperature drift and manufacturing tolerances when a single CW tone or carrier signal rejection is required.

Figure 8:
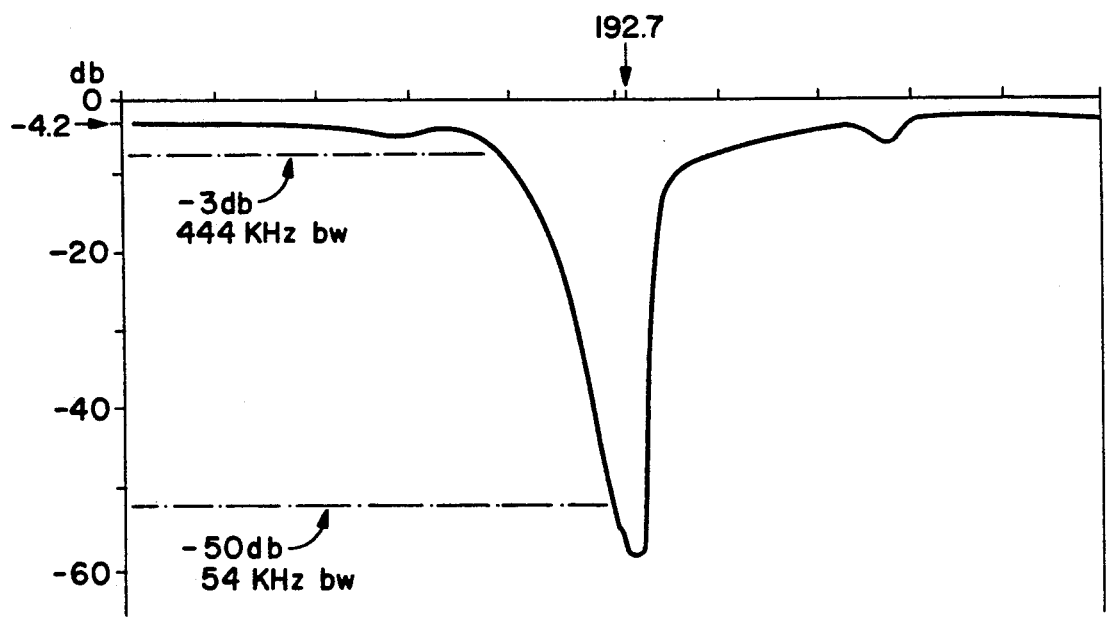
FIG. 8 is a plot of the frequency response of cascaded SAW notch filters of FIG. 6.

Cascading two of the filters of FIG. 7 provided the response shown in FIG. 8. A notch of about 50 db, a 3-db bandwidth of 444 kHz and a 50-db bandwidth of about 54 kHz were achieved. Cascaded single-pole SAW resonators produced the response shown by the dashed line.

Figure 9:
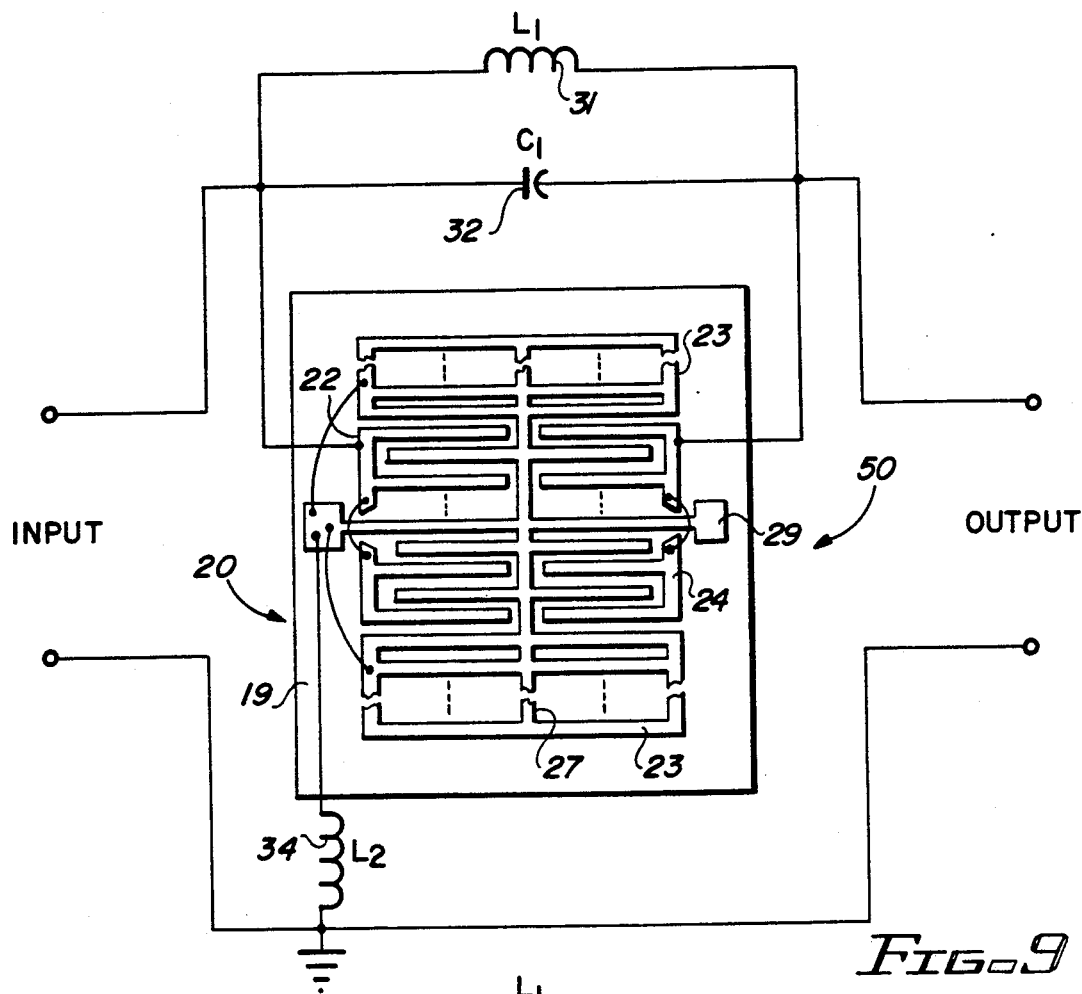
FIG. 9 is a schematic diagram of a two-pole SAW resonator notch filter using the improved resonator of FIG. 2.

The two-pole SAW notch filter may be implemented with the improved SAW resonator of the invention as shown in schematic diagram form in FIG. 9. Notch filter 50 is a SAW resonator 20 fabricated on piezoelectric substrate 19 which may be quartz or lithium tantalate. Resonator 20 has input transducer 22 and output transducer 24 connected as capacitors 33 of a bridged-T network as previously described with respect to FIG. 6. The reduced ground bus bar resistance of resonator 20 permits the notch filter to be implemented at higher frequencies than the configuration of FIG. 6.

Figure 10:
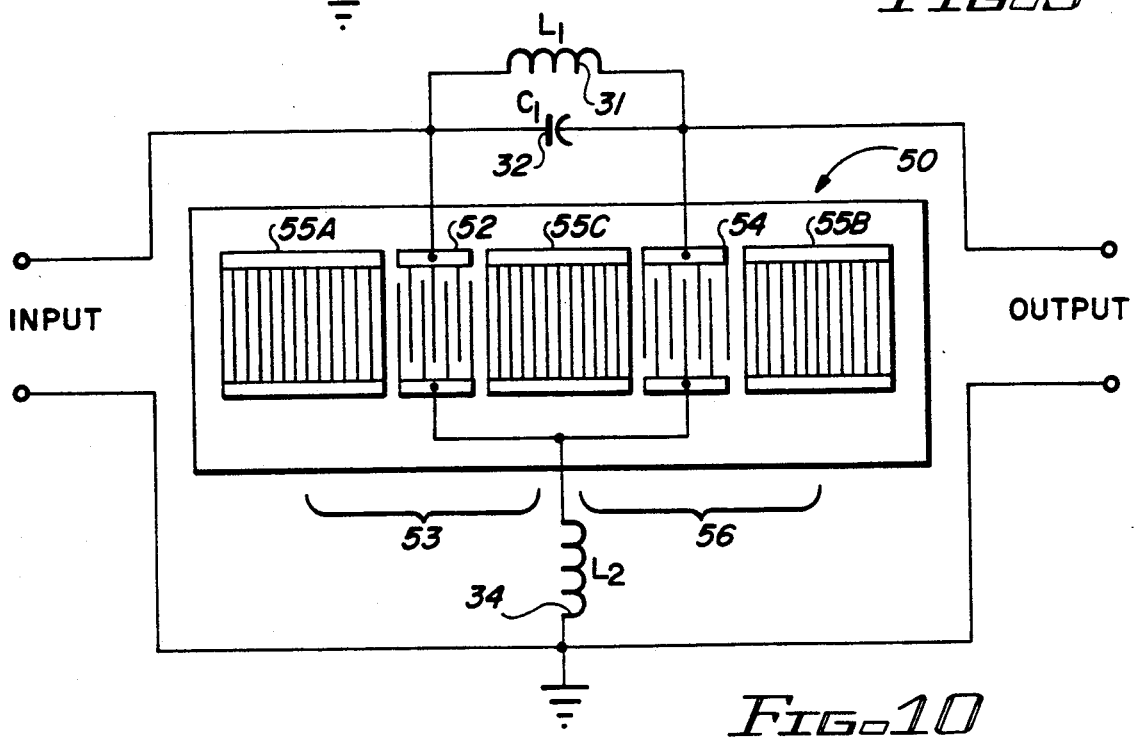
FIG. 10 is a schematic diagram of a SAW notch filter using a two-pole, in-line SAW resonator.

Although a two pole WGC SAW resonator has been shown for the notch filter of the invention, a two-pole SAW in-line coupled resonator may be used. FIG. 10 is a schematic diagram of such a notch filter. SAW resonator 50 includes a first resonator 53 formed by reflector 55A and input transducer 52, a second resonator 56 formed by reflector 55B and output transducer 54, with both resonators coupled to reflector 55C. Resonator 50 is embedded in the bridged-T allpass network to provide capacitances 33 of FIG. 5, in a manner previously described.

As will now be recognized, an improved two-pole SAW resonator effective at higher frequencies than previously usable, and a notch filter having suitable characteristics for such frequencies have been disclosed. The acoustic coupling between transducers in the resonators of the invention produce an impedance characteristic that permits realization of the SAW notch filter when embedded in an allpass network having only three components to tune, producing a more stable notch filter. The small size of the filter permits its use at frequencies as low as 50 MHz.

Although specific circuits and arrangements have been disclosed for exemplary purposes, various modifications may be made thereto without departing from the spirit and scope of the invention.

REFERENCES:

[1]Tanaka, M. et al, "Narrow Bandpass Filter Using Double-Mode SAW Resonators on Quartz", 1984 Frequency Control Proceeding, IEEE 84CH2062-8.

[2]Akiit, D. P., "70 MHz Surface Acoustic Wave Resonator Notch Filter", 1976 Electronic Letters, Vol. 12, pp 217–218.

We claim:

1. A surface acoustic wave resonator notch filter comprising:

a portion of a bridged-T allpass circuit having a series inductor in parallel with a first capacitor, and a parallel inductor having a first terminal connected to a notch filter ground;

a surface acoustic wave waveguide-coupled resonator filter having over-coupled input and output resonators, said filter having an essentially constant conductance, and an essentially constant susceptance over at least a desired notch filter bandwidth, said filter having input and output terminals and a ground terminal; and said input and output terminals connected in parallel with said series inductor, and a resonator filter ground connected to a second terminal of said parallel inductor.

2. The notch filter as defined in claim 1 in which said input and output resonators each include an interdigital transducer.

3. The notch filter as defined in claim 1 in which said surface acoustic wave resonator filter includes at least two poles.

4. The notch filter as defined in claim 3 in which said surface acoustic wave resonator filter includes four poles.

5. A surface acoustic wave notch filter comprising:
a portion of a bridged-T allpass circuit having a series inductor in parallel with a first capacitor, and a parallel inductor having a first terminal connected to a notch filter ground;
a surface acoustic wave, over-coupled two-pole in-line resonator filter, said filter having an essentially constant conductance, and an essentially constant susceptance over at least a desired notch filter bandwidth, said filter having input and output terminals and a ground terminal; and
said input and output terminals connected in parallel with said series inductor, and a resonator filter ground connected to a second terminal of said parallel inductor.

6. A surface acoustic wave resonator notch filter comprising:
a portion of a bridged-T allpass circuit having a series inductor in parallel with a first capacitor, and a parallel inductor having a first terminal connected to a notch filter ground;
a surface acoustic wave waveguide-coupled resonator filter having a low resistance first ground bus bar formed by a two-section input resonator and a two-section output resonator deposited on a piezoelectric substrate, each said resonator having conductive means connecting respective sections thereof, and a second ground bus bar deposited on said substrate between the two sections of each resonator and connected to secondary grounding pads, said filter having an essentially constant conductance and an essentially constant susceptance over at least a desired notch filter bandwidth, said filter having input and output terminals and a ground terminal; and
said input and output terminals connected in parallel with said series inductor, and a resonator filter ground connected to a second terminal of said parallel inductor.

7. The notch filter as defined in claim 6 in which each of the input and output resonators includes an interdigital transducer.

8. The notch filter as defined in claim 7 in which the filter includes two or more poles.

* * * * *